US012764885B2

(12) United States Patent
Zimmerman et al.

(10) Patent No.: US 12,764,885 B2
(45) **Date of Patent: *Oct. 13, 2026**

(54) UNIVERSAL MOUNTING BRACKET

(71) Applicant: Crestron Electronics, Inc., Rockleigh, NJ (US)

(72) Inventors: Jeremiah Zimmerman, Carrolton, TX (US); Michael Zamalkany, Pomona, NY (US); Donald Florczak, Tenafly, NJ (US)

(73) Assignee: Crestron Electronics, Inc., Rockleigh, NJ (US)

( * ) Notice: Subject to any disclaimer, the term of this patent is extended or adjusted under 35 U.S.C. 154(b) by 111 days.

This patent is subject to a terminal disclaimer.

(21) Appl. No.: 19/047,819

(22) Filed: Feb. 7, 2025

(65) Prior Publication Data

US 2025/0185200 A1 Jun. 5, 2025

Related U.S. Application Data

(63) Continuation of application No. 18/213,940, filed on Jun. 26, 2023, now Pat. No. 12,256,511.

(51) Int. Cl.
*H05K 7/14* (2006.01)
*F16M 11/04* (2006.01)
(Continued)

(52) U.S. Cl.
CPC ......... *H05K 7/1401* (2013.01); *F16M 11/041* (2013.01); *F16M 13/02* (2013.01); *H05K 7/1417* (2013.01); *H04M 1/04* (2013.01)

(58) Field of Classification Search
CPC .. H05K 7/1401; H05K 7/1417; F16M 11/041; F16M 13/02; H04M 1/04
(Continued)

(56) References Cited

U.S. PATENT DOCUMENTS 2,541,434 A * 2/1951 Nelson ...................... E06C 7/14
192/105 BB
2,756,369 A * 7/1956 Gorrie ...................... H05K 7/18
312/351
(Continued)

FOREIGN PATENT DOCUMENTS

| | | | | |
|---|---|---|---|---|
| CN | 115623723 A | | 1/2023 | |
| GB | 2528900 A | * | 2/2016 | ......... E05B 73/0082 |
| KR | 20210146527 A | * | 12/2021 | ............. H04M 1/04 |

*Primary Examiner* — Taylor Morris
(74) *Attorney, Agent, or Firm* — CRESTRON ELECTRONICS, INC.

(57) ABSTRACT

A mounting bracket holds electronic device modules having various sizes and shapes. The mounting bracket includes a mounting plate. An adjustable clamp includes a fixed part attached to the mounting plate, and a movable part that is movable to any spacing from the mounting plate within a preset range and is securable anywhere within the preset range. The adjustable clamp holds an electronic device module against the mounting plate. A movable slat moves along the mounting plate to any distance from the fixed part within a fixed range and is securable to the mounting plate anywhere within the fixed range. The movable slat holds the electronic device module against the fixed part. The mounting bracket therefore holds electronic device modules of various sizes and shapes upon the electronic device module having a thickness within a range of thicknesses and a height within a range of heights.

20 Claims, 12 Drawing Sheets

(51) Int. Cl.
*F16M 13/02* (2006.01)
*H04M 1/04* (2006.01)

(58) Field of Classification Search
USPC .......................................... 248/274.1, 297.21
See application file for complete search history.

(56) References Cited

U.S. PATENT DOCUMENTS 3,204,776 A * 9/1965 Brown ..................... B25H 3/04 248/222.41
3,944,176 A 3/1976 Danko
4,531,645 A * 7/1985 Tisbo ....................... B25H 3/06 211/163
5,076,079 A * 12/1991 Monoson ............ E05B 73/0005 248/680
5,683,066 A 11/1997 Mccann
5,871,192 A 2/1999 Horwitz
5,927,668 A 7/1999 Cyrell
6,382,580 B1 5/2002 Wisniewski
6,402,111 B1 * 6/2002 Stewart .............. A47B 21/0314 248/316.1
6,460,817 B1 10/2002 Bosson
6,700,488 B1 * 3/2004 Leyden .............. G08B 13/1463 340/568.1
6,749,168 B2 6/2004 Johnson
7,187,283 B2 * 3/2007 Leyden .............. G08B 13/1463 340/568.1
7,195,213 B2 3/2007 Weatherly
7,611,112 B2 11/2009 Lin
7,845,501 B1 12/2010 Fosburg
7,866,623 B2 1/2011 Lampman
8,141,836 B2 3/2012 Saez
8,403,289 B1 3/2013 Rinderer
8,453,985 B2 6/2013 Peng
9,022,337 B2 5/2015 Petruskavich
9,229,495 B2 1/2016 Kuo
9,403,569 B2 8/2016 Oquendo et al.
D794,420 S 8/2017 Emmons
9,885,846 B2 2/2018 Kowlaczyk
10,034,406 B2 7/2018 Chapel et al.
10,208,777 B1 * 2/2019 Brassard .............. F16M 11/041
10,409,020 B2 9/2019 Geens
10,583,789 B2 * 3/2020 Oshima .................. B60K 35/22
10,851,935 B1 * 12/2020 Huang .................. G06F 1/1656
2007/0022582 A1 * 2/2007 Carnevali ............ F16M 11/041 24/523
2009/0084921 A1 4/2009 Tu
2009/0090839 A1 4/2009 Lin
2010/0148030 A1 * 6/2010 Lin ..................... B60R 11/0252 248/371
2011/0260026 A1 * 10/2011 Ye .......................... F16M 11/04 248/298.1
2013/0001382 A1 * 1/2013 Jang .......................... A45F 5/10 248/176.1
2014/0061405 A1 * 3/2014 Lee ........................ F16M 13/02 248/200
2015/0250364 A1 9/2015 Yamada
2015/0264823 A1 * 9/2015 Shirley .................. F16M 13/02 248/287.1
2015/0355531 A1 * 12/2015 Ben Yehuda .......... F16M 13/04 396/420
2016/0130015 A1 5/2016 Caubel et al.
2016/0154295 A1 6/2016 Chang et al.
2016/0374215 A1 * 12/2016 Danicich ................. F16B 2/185
2018/0352956 A1 * 12/2018 Gebril .................. A47B 97/001
2020/0146167 A1 * 5/2020 Manouel .............. H05K 7/1452
2020/0232598 A1 * 7/2020 Roudaut .............. F16M 11/041
2020/0370704 A1 * 11/2020 Mooney ............... F16M 11/041
2021/0059437 A1 * 3/2021 Chapuis ................. F16M 11/04
2021/0244201 A1 * 8/2021 Galant ................. F16M 13/022
2021/0310610 A1 * 10/2021 Fehr ........................ F16B 2/065
2023/0055167 A1 * 2/2023 Ortiz ........................ H02G 3/10

* cited by examiner

UNIVERSAL MOUNTING BRACKET

CROSS-REFERENCE TO RELATED APPLICATIONS

This application is a continuation of U.S. application Ser. No. 18/213,940, filed Jun. 26, 2023, the disclosure of which is incorporated herein by reference.

BACKGROUND OF THE INVENTION

Technical Field

The present embodiments relate to a mounting bracket and, more particularly, to a universal mounting bracket upon which may be mounted one or more electronic device modules, such as processor units and associated modules, having various sizes and shapes.

Background Art

In the manufacturing of electronic systems, it is often desirable to house various electronic device modules on a single mounting bracket. For example, a processor module and other device modules and peripherals of a particular system may be housed on the same mounting bracket. The mounting bracket is typically specific to that system, with the clamps and connectors laid out for the specific components of that system.

Because each electronic system uses a mounting bracket specific to that electronic, manufacturers must design, develop, and tool a new bracket for manufacture each time a new electronic system is developed or upgraded. As a result, a manufacturer of multiple electronic systems typically incurs the cost of designing and manufacturing multiple types of mounting brackets.

It is therefore desirable to provide one mounting bracket suitable for housing different kinds of electronic systems. It is further desirable to provide one mounting bracket suitable for housing various combinations and arrangements of different sized and/or shaped electronic device modules and their connections and peripherals.

SUMMARY OF THE INVENTION

It is to be understood that both the general and detailed descriptions that follow are exemplary and explanatory only and are not restrictive.

DISCLOSURE OF INVENTION

In accordance with an aspect, a mounting bracket holds electronic device modules having various sizes and shapes. The mounting bracket comprises (a) a mounting plate; (b) an adjustable clamp assembly, including (1) a fixed part attached to the mounting plate, and (2) a movable part that is movable to any spacing from the mounting plate that is within a preset range of spacings, the movable part being securable in place anywhere within the preset range of spacings, (3) the adjustable clamp assembly thereby being adjustable to hold, against the mounting plate using the movable part, an electronic device module having any thickness within a range of thicknesses corresponding to the preset range of spacings; and (c) a movable slat that is movable along the mounting plate to any distance from the fixed part that is within a fixed range of distances, and being securable to the mounting plate anywhere within the fixed range of distances, (1) the movable slat thereby being movable to hold the electronic device module against the fixed part by moving and securing the movable slat, the electronic device module having any height within a range of heights corresponding to the fixed range of distances; (d) the mounting bracket thereby being able to hold electronic device modules of various sizes and shapes upon the electronic device module having a thickness within the range of thicknesses and a height within the range of heights.

According to a further aspect, a mounting bracket holds electronic device modules having various sizes and shapes. The mounting bracket comprises (a) a mounting plate; (b) a first adjustable clamp assembly, including (1) a first fixed part attached to the mounting plate, and (2) a first movable part that is movable to any spacing from the mounting plate that is within a first preset range of spacings, the first movable part being securable in place anywhere within the first preset range of spacings, (3) the first adjustable clamp assembly thereby being adjustable to hold, against the mounting plate using the first movable part, a first electronic device module having a thickness within a first range of thicknesses corresponding to the first preset range of spacings; and (c) a first movable slat that is movable along the mounting plate to any distance from the first fixed part that is within a first fixed range of distances, and being securable to the mounting plate anywhere within the first fixed range of distances, (1) the first movable slat thereby being movable to hold the first electronic device module against the first fixed part by moving and securing the first movable slat, the first electronic device module having a height within a first range of heights corresponding to the first fixed range of distances; (d) a second adjustable clamp assembly, including (1) a second fixed part attached to the mounting plate, and (2) a second movable part that is movable to any spacing from the mounting plate that is within a second preset range of spacings, the second movable part being securable in place anywhere within the second preset range of spacings, (3) the second adjustable clamp assembly thereby being adjustable to hold, against the mounting plate using the second movable part, a second electronic device module having a thickness within a second range of thicknesses corresponding to the second preset range of spacings; and (e) a second movable slat that is movable along the mounting plate to any distance from the second fixed part that is within a second fixed range of distances, and being securable to the mounting plate anywhere within the second fixed range of distances, (1) the second movable slat thereby being movable to hold the second electronic device module against the second fixed part by moving and securing the movable slat, the second electronic device module having a height within a second range of heights corresponding to the second fixed range of distances; (f) the mounting bracket thereby being able to hold first and second electronic device modules of various sizes and shapes upon the first electronic device module having a respective thickness within the first range of thicknesses and a respective height within the first range of heights and the second electronic device module having a respective thickness within the second range of thicknesses and a respective height within the second fixed range of heights.

According to another aspect, a mounting bracket holds electronic device modules having various sizes and shapes. The mounting bracket comprises (a) a mounting plate, including (1) first and second slits that each extend along a respective part of the mounting plate in a first direction, (2) a plurality of openings configured to relieve stresses on the mounting plate, and (3) a plurality of recesses configured to relieve stresses on the mounting plate; (b) a first adjustable clamp assembly, including (1) a first fixed part attached to the mounting plate along a second direction in the mounting plate, and extending outward from the mounting plate along a third direction away from a plane formed by the first direction and the second direction, (2) a first movable part that is movable to any spacing from the mounting plate that is within a first preset range of spacings, the first movable part being securable in place anywhere within the first preset range of spacings, (3) the first adjustable clamp assembly thereby being adjustable to hold, against the mounting plate using the first movable part, a first electronic device module having a thickness within a first range of thicknesses corresponding to the first preset range of spacings, and (4) a first adhesive-backed reclosable fastener piece affixed to a surface of the first movable part facing the mounting plate, the first adhesive-backed reclosable fastener piece being configured to adhere to another adhesive-backed reclosable fastener piece disposed on a surface of the first electronic device module to further secure the first electronic device module in place while the first adjustable clamp assembly holds the first electronic device module; and (c) a first movable slat that is movable along the first slit to any location along the first slit and being securable to the mounting plate anywhere along the first slit, the length of the first slit defining a first range of distances from the first fixed part, (1) the first movable slat thereby being movable to hold the first electronic device module against the first fixed part by moving and securing the first movable slat, the first electronic device module having a height within a first range of heights corresponding to the first range of distances; (d) a second adjustable clamp assembly, including (1) a second fixed part attached to the mounting plate along the second direction in the mounting plate, and extending outward from the mounting plate along a direction opposite to the third direction, (2) a second movable part that is movable to any spacing from the mounting plate that is within a second preset range of spacings, the second movable part being securable in place anywhere within the second preset range of spacings, (3) the second adjustable clamp assembly thereby being adjustable to hold, against the mounting plate using the second movable part, a second electronic device module having a thickness within a second range of thicknesses corresponding to the second preset range of spacings, and (4) a second adhesive-backed reclosable fastener piece affixed to a surface of the second movable part facing the mounting plate, the second adhesive-backed reclosable fastener piece being configured to adhere to another adhesive-backed reclosable fastener piece disposed on a surface of the second electronic device module to further secure the second electronic device module in place while the second adjustable clamp assembly holds the second electronic device module; and (e) a second movable slat that is movable along the second slit to any location along the second slit and being securable to the mounting plate anywhere along the second slit, the length of the second slit defining a second range of distances from the second fixed part, (1) the second movable slat thereby being movable to hold the second electronic device module against the second fixed part by moving and securing the second movable slat, the second electronic device module having a height within a second range of heights corresponding to the second range of distances; (f) the mounting bracket thereby being able to hold first and second electronic device modules of various sizes and shapes upon the first electronic device module having a respective thickness within the first range of thicknesses and a respective height within the first range of heights and the second electronic device module having a respective thickness within the second range of thicknesses and a respective height within the second fixed range of heights.

BRIEF DESCRIPTION OF DRAWINGS

The accompanying figures further illustrate the present embodiments.

The components in the drawings are not necessarily drawn to scale, emphasis instead being placed upon clearly illustrating the principles of the present embodiments. In the drawings, like reference numerals designate corresponding parts throughout the several views.

BRIEF DESCRIPTION OF THE SEVERAL VIEWS OF THE DRAWING

Figure 1:
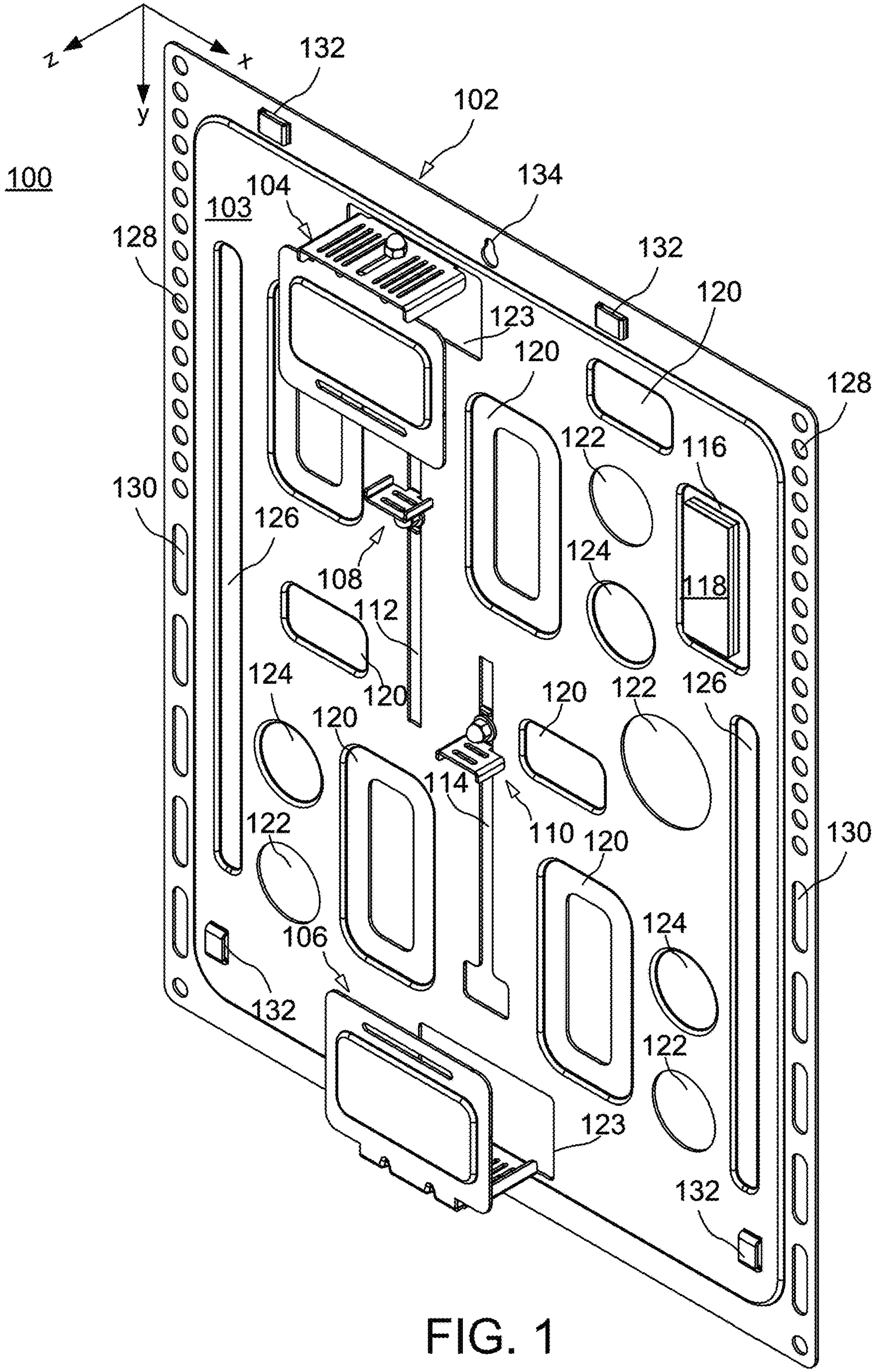

FIG. 1 is a top perspective view of a universal mounting bracket in accordance with an embodiment.

Figure 2:
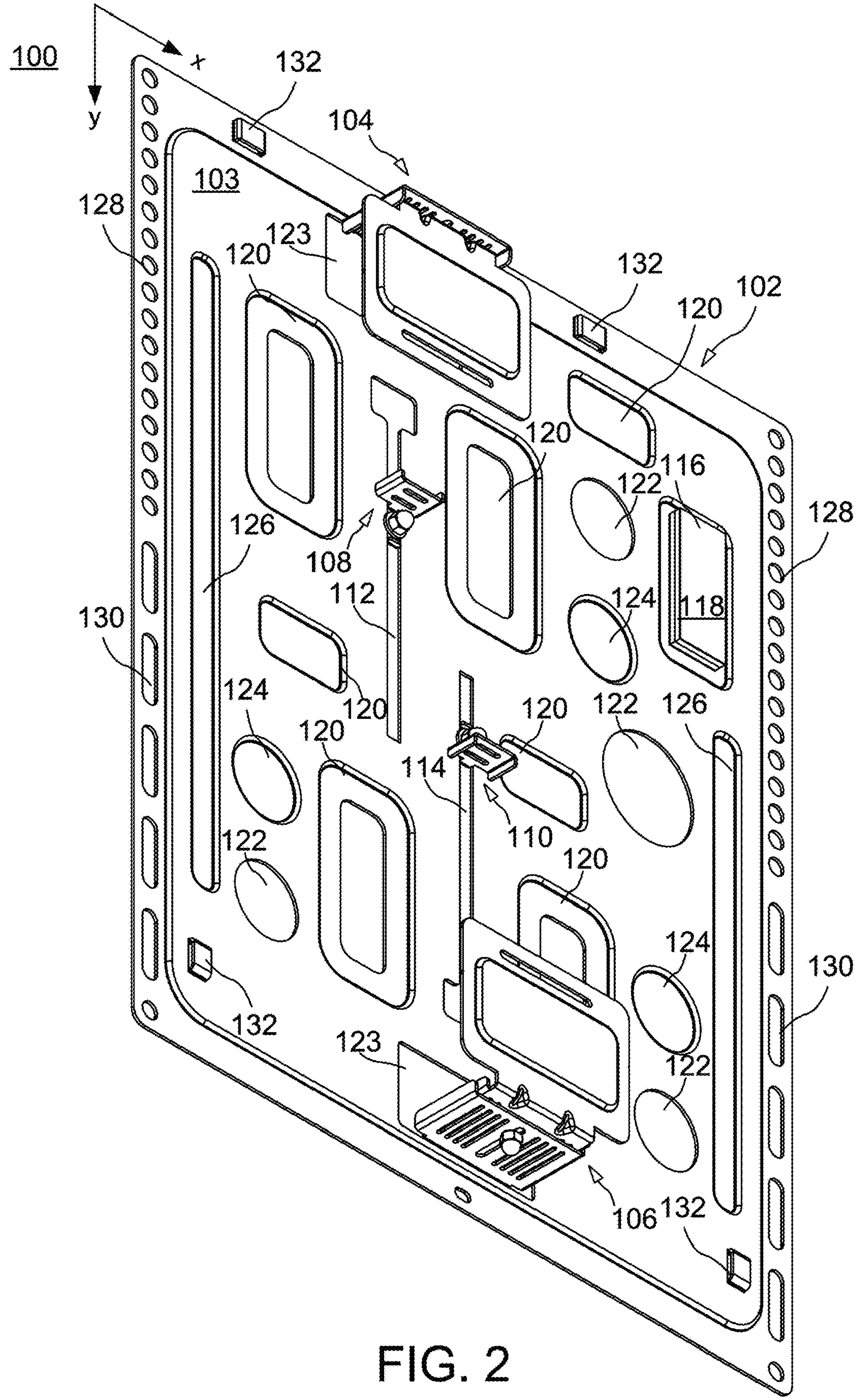

FIG. 2 is a bottom perspective view of the universal mounting bracket of FIG. 1.

Figure 3:
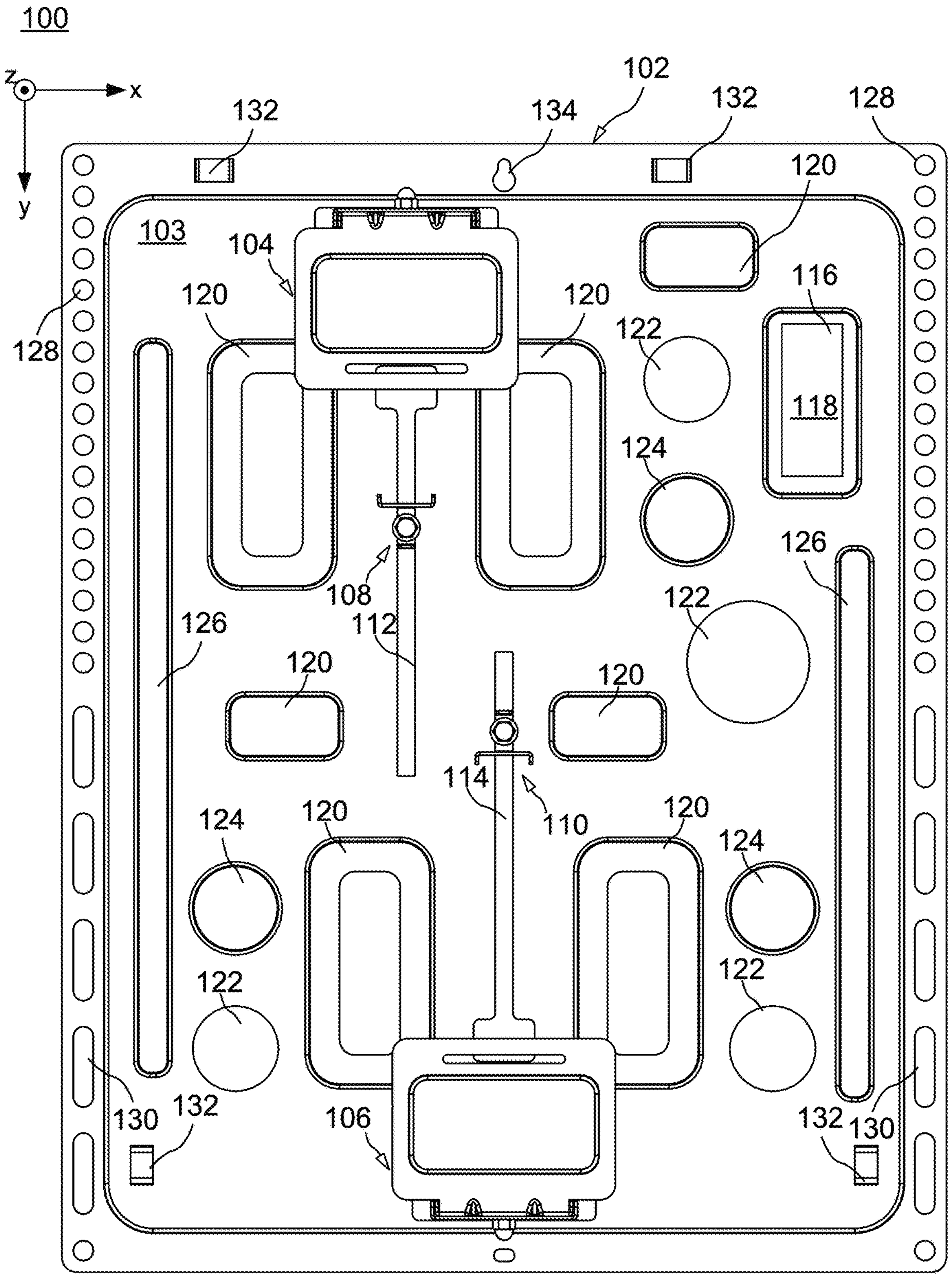

FIG. 3 is a front elevation view of the universal mounting bracket of FIG. 1.

Figure 4:
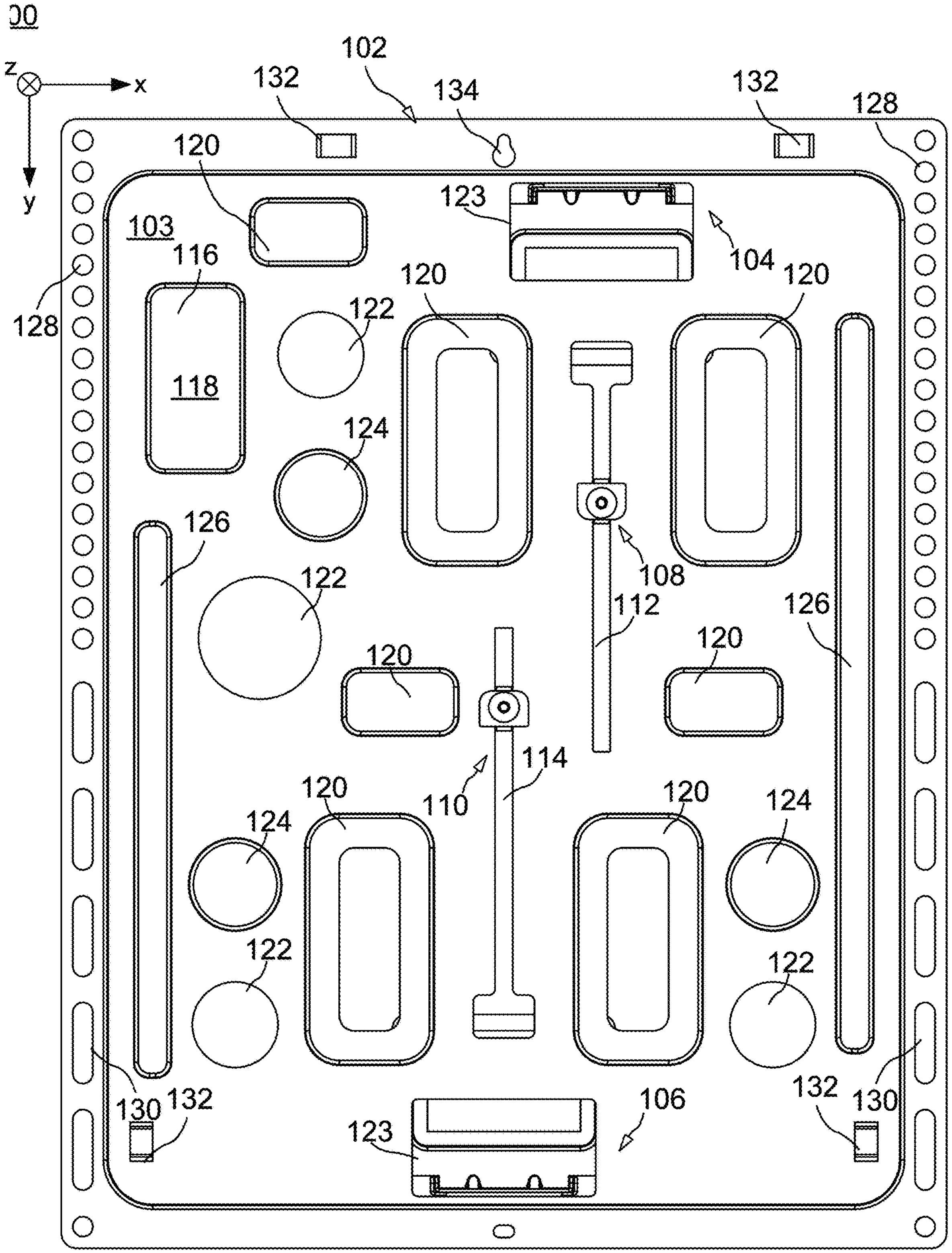

FIG. 4 is a rear elevation view of the universal mounting bracket of FIG. 1.

Figure 5:
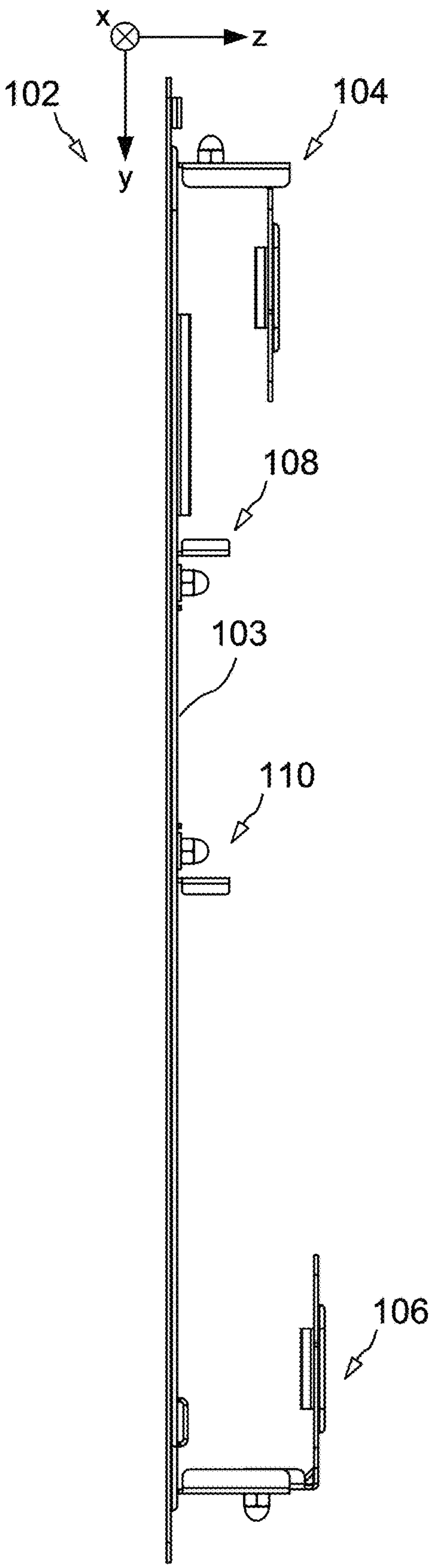

FIG. 5 is a side elevation view of the universal mounting bracket of FIG. 1.

FIGS. 6A-6D are enlarged top perspective, bottom perspective, rear elevation, and side elevation views, respectively, of an upper clamp assembly of the universal mounting bracket of FIG. 1.

FIGS. 7A-7D are enlarged top perspective, bottom perspective, rear elevation, and side elevation views, respectively, of a lower clamp assembly of the universal mounting bracket of FIG. 1.

Figure 8A:
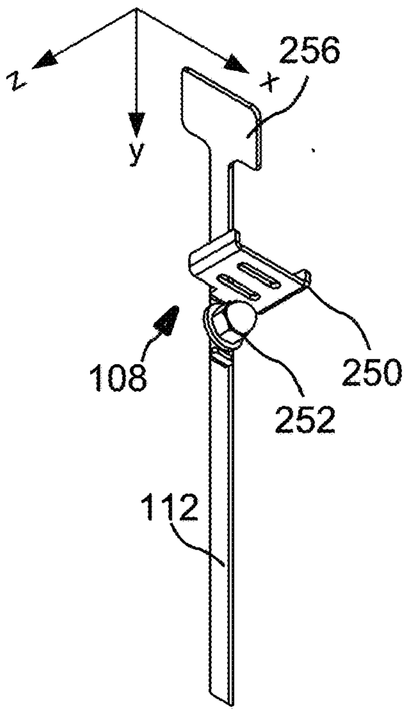
Figure 8B:
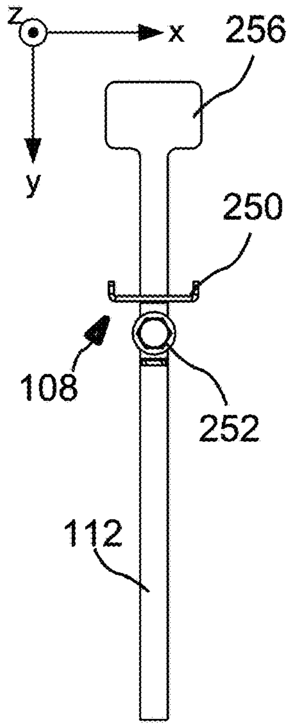
Figure 8C:
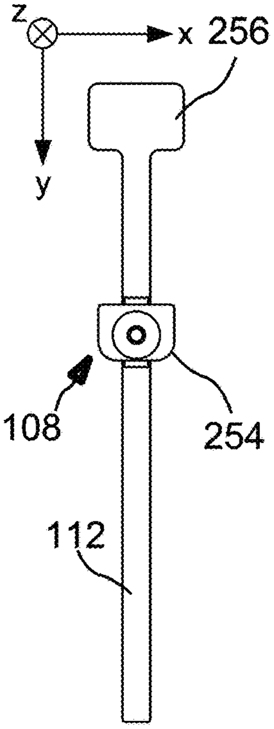

FIGS. 8A-8C are enlarged perspective, front elevation, and rear elevation views, respectively, of a slideable slat assembly of the universal mounting bracket of FIG. 1.

Figure 9A:
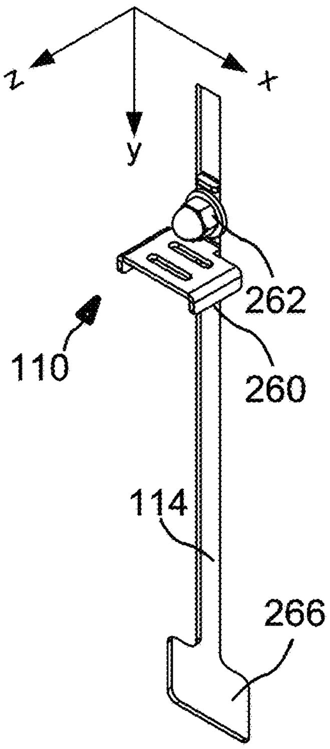
Figure 9B:
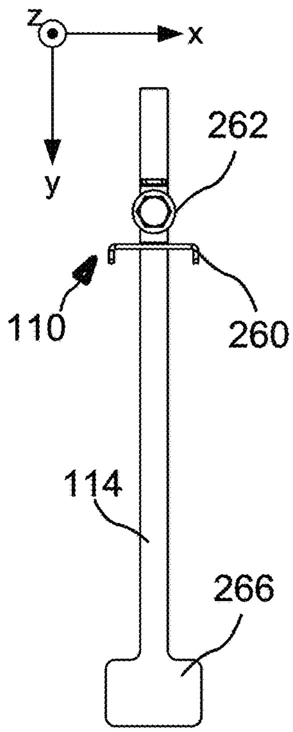
Figure 9C:
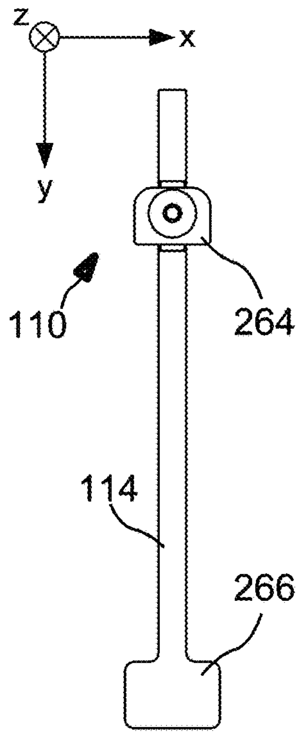

FIGS. 9A-9C are enlarged perspective, front elevation, and rear elevation views, respectively, of another slideable slat assembly of the universal mounting bracket of FIG. 1.

Figure 10A:
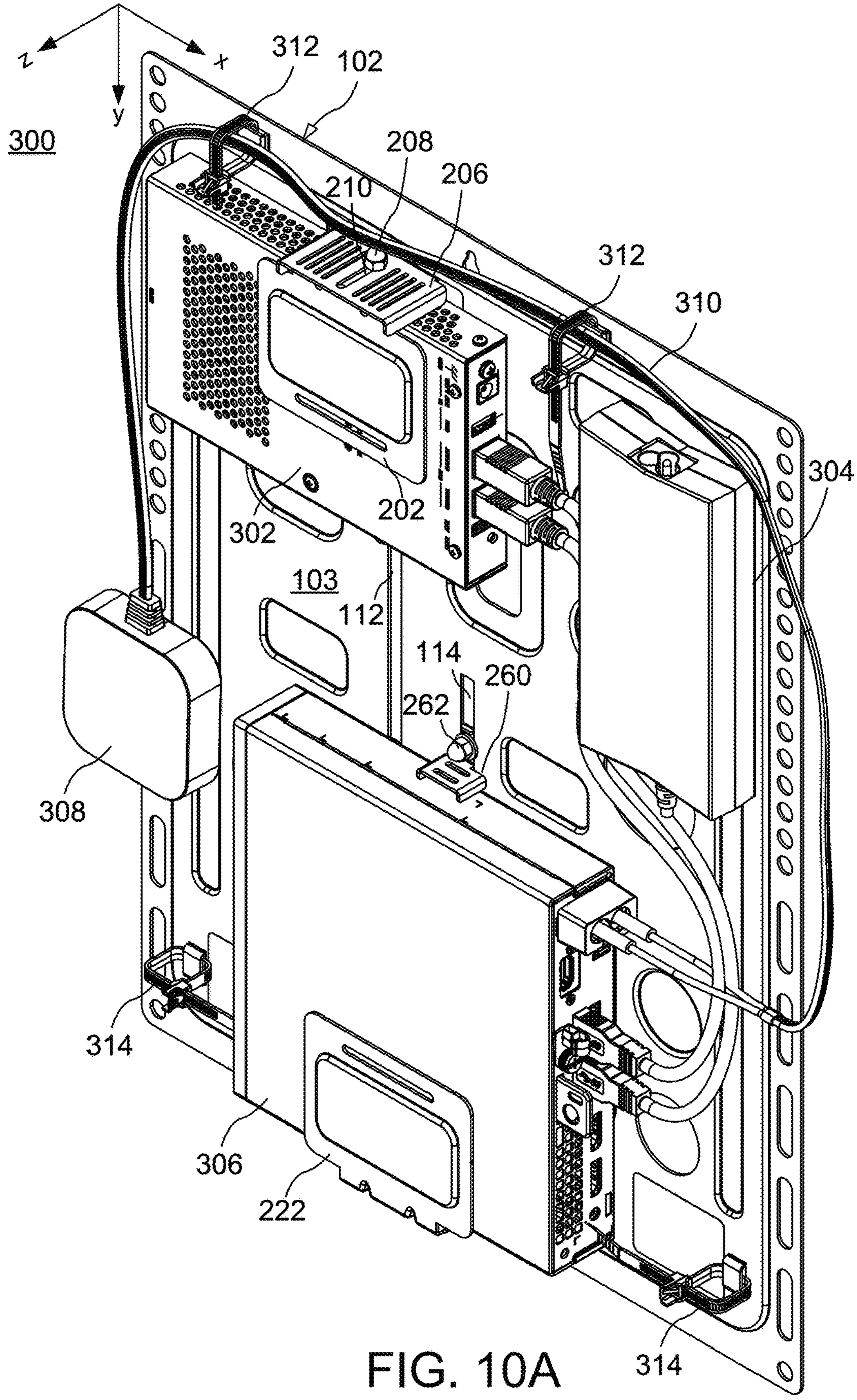
Figure 10B:
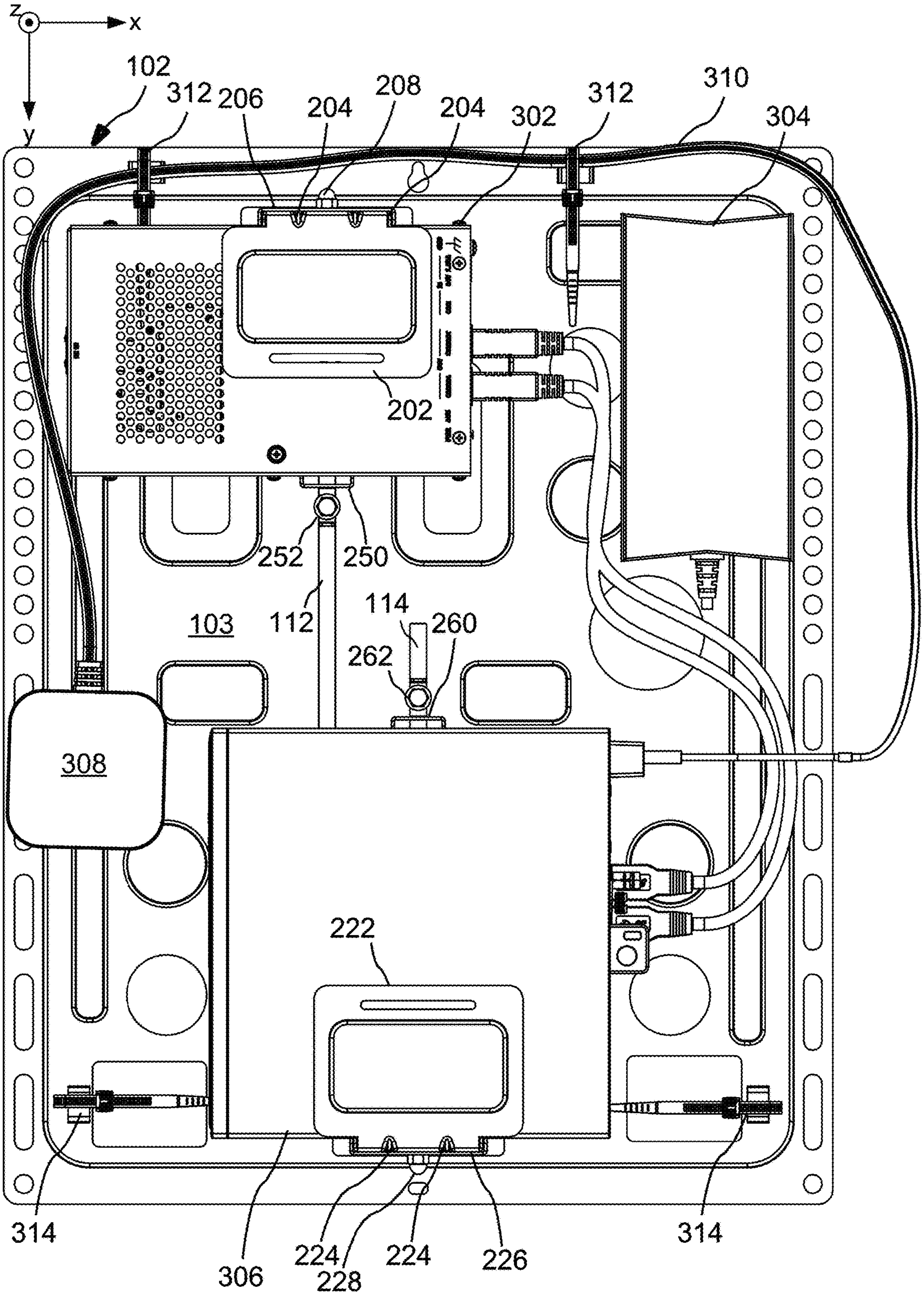

FIGS. 10A and 10B are perspective and front elevation views, respectively, of the universal mounting bracket of FIG. 1 showing an arrangement of electronic device modules and other elements mounted thereon.

Figure 11A:
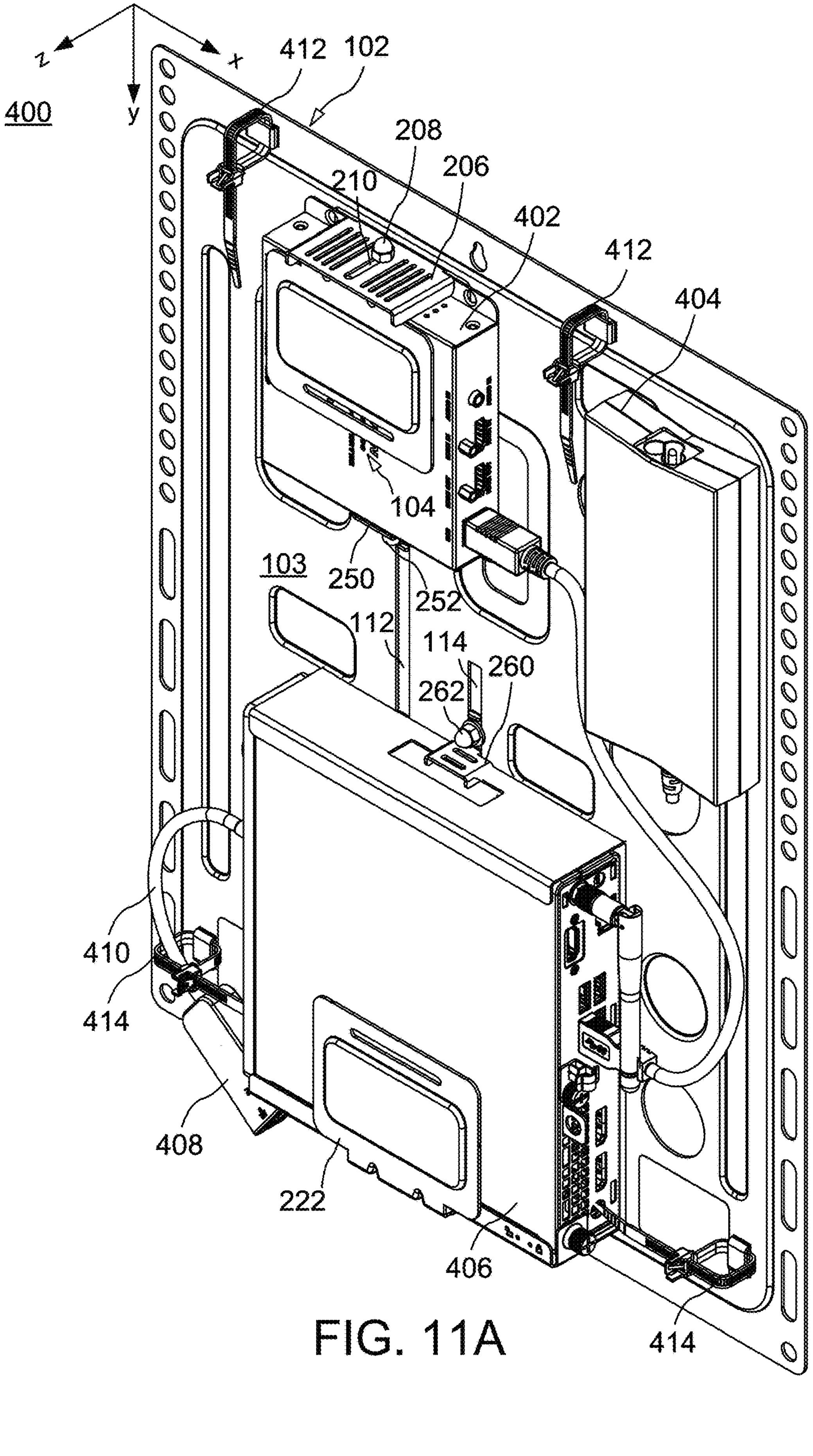
Figure 11B:
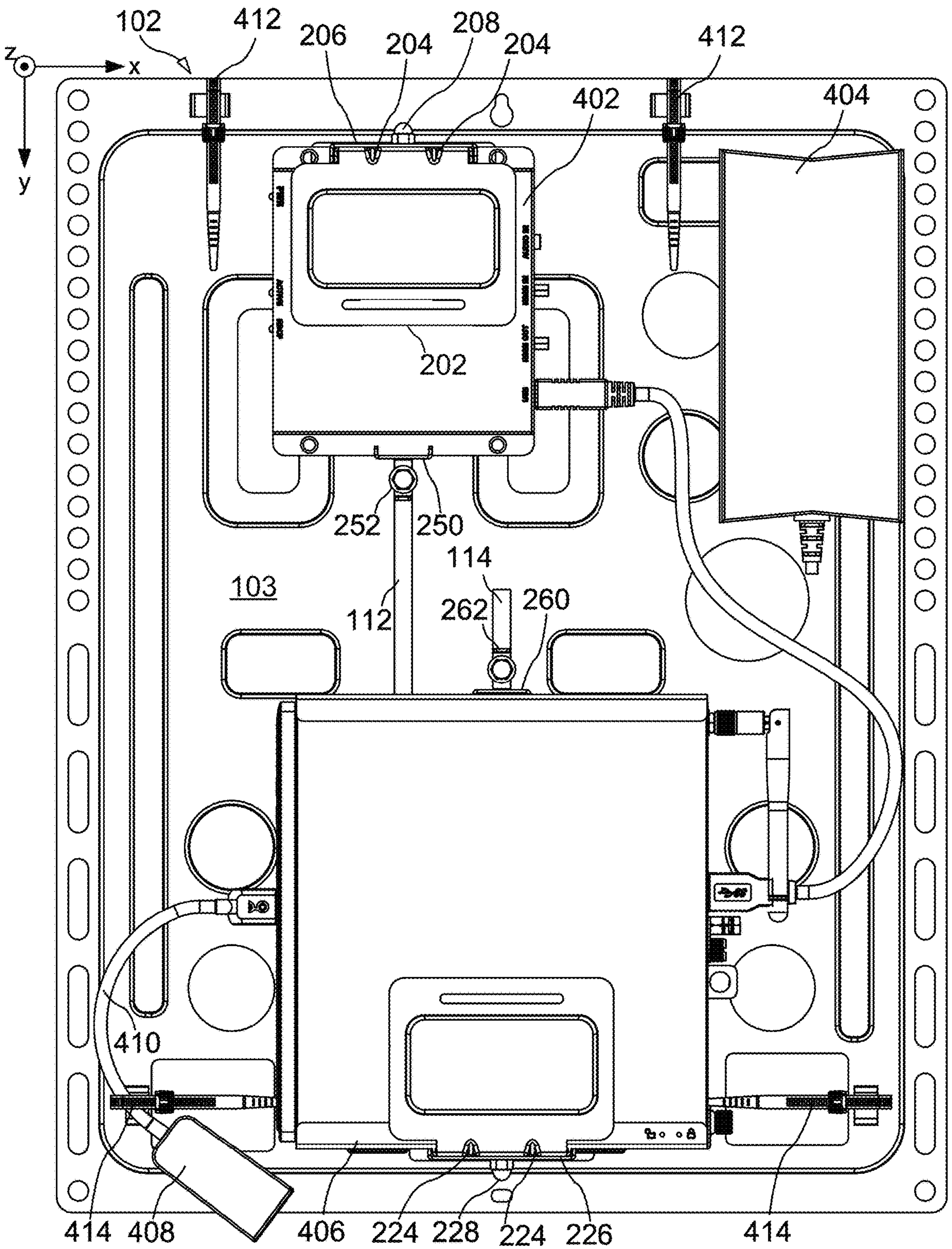

FIGS. 11A and 11B are perspective and front elevation views, respectively, of the universal mounting bracket of FIG. 1 showing another arrangement of electronic device modules and other elements mounted thereon.

DETAILED DESCRIPTION OF THE INVENTION

The present embodiments provide a universal mounting bracket for holding one or more of a plurality of different sized and shaped electronic device modules.

Unless the context clearly requires otherwise, throughout the description and the claims, the words 'comprise,' 'comprising', and the like are to be construed in an inclusive sense as opposed to an exclusive or exhaustive sense; that is to say, in the sense of "including, but not limited to".

LIST OF REFERENCE NUMBERS FOR THE MAJOR ELEMENTS IN THE DRAWING

The following is a list of the major elements in the drawings in numerical order.

100 Universal Mounting Bracket
102 Mounting Plate
103 Planar Part of Mounting Plate
104 First Adjustable Clamp Assembly
106 Second Adjustable Clamp Assembly
108 First Adjustable Slat Assembly
110 Second Adjustable Slat Assembly
112 First Slit
114 Second Slit
116 Mounting Indentation
118 Adhesive-Backed Reclosable Fastener Piece
120 Indentation
122 Opening
123 Opening
124 Indentation
126 Indentation
128 Side Openings
130 Side Slots
132 Pull Tie Receptacle
134 End Opening
202 First Movable Part
204 Sliders
205 Rails
206 First Fixed Part
207 Inner Surface of First Fixed Part
208 Locking Knob
210 First Fixed Part Slot
214 First Movable Part Indentation
216 First Adhesive-Backed Reclosable Fastener Piece
222 Second Movable Part
224 Sliders
225 Rails
226 Second Fixed Part
227 Inner Surface of Second Fixed Part
228 Locking Knob
230 Second Fixed Part Slot
234 Second Movable Part Indentation
236 Second Adhesive-Backed Reclosable Fastener Piece
250 First Slat
252 Securing Knob
254 Back Plate
256 Insert Opening
260 Second Slat
262 Securing Knob
264 Back Plate
266 Insert Opening
300 Arrangement
302 First Device Module
304 Peripheral Device
306 Second Device Module
308 Peripheral Device
310 Cable
312 Pull Tie
314 Pull Tie
400 Arrangement
402 First Device Module
404 Peripheral Device
406 Second Device Module
408 Peripheral Device
410 Cable
412 Pull Tie
414 Pull Tie

MODE(S) FOR CARRYING OUT THE INVENTION

The embodiment described herein in the context of a universal mounting bracket, but is not limited thereto, except as may be set forth expressly in the appended claims.

Referring first to FIGS. 1-5, a universal mounting bracket 100 is shown in accordance with an embodiment. Specifically, FIG. 1 is a top perspective view of the universal mounting bracket 100, FIG. 2 is a bottom perspective view, FIG. 3 is a front elevation view, FIG. 4 is a rear elevation view, and FIG. 5 is a side elevation view. In each of the figures of the disclosure, like reference numerals refer to like elements.

The universal mounting bracket 100 includes a mounting plate 102 having a planar part 103. Attached to the planar part 103 is a first adjustable clamp assembly 104 that is configured to hold a first electronic device module (not shown) against the mounting plate 102. Also provided is a first adjustable slat assembly 108 that is configured to further secure the first electronic device module in place.

A second adjustable clamp assembly 106 is configured to hold a second electronic device module (not shown) against the mounting plate 102. Also provided is a second adjustable slat assembly 110 that is configured to further secure the second electronic device module in place.

The planar part 103 of mounting plate 102 also includes at least one mounting indentation 116 upon which is affixed a piece of an adhesive-backed reclosable fastener ("adhesive-backed reclosable fastener piece") 118, such as a VELCRO®[1] Brand adhesive-backed fastener or other hook and loop fastener. The adhesive-backed reclosable fastener piece may be used to secure, to the mounting VELCRO® is a registered trademark of Velcro IP Holdings LLC. plate 102, a component (not shown) to which has been affixed a further adhesive-backed reclosable fastener piece.

The planar part 103 of the mounting plate 102 further includes various indentations 120, 124 and 126 as well as various openings 122 and 123. The indentations 120, 124 and 126 and the openings 122 and 123 are provided to relieve stresses in the mounting plate 102.

One or more pull tie receptacles 132 may also be provided to permit the use of pull ties secure any needed wiring or further secure an electronic device module. Also provided is a top opening 134 which may be used to mount the mounting plate to a surface.

A plurality of side openings 128 and a plurality of side slots 130 are provided at each edge of the mounting plate 102. The side openings 128 and side slots 130 may be used to mount the mounting plate 102 horizontally in an electronics rack or vertically on a stand. The side openings 128 and side slots 130 may also be used to mount one or more additional components.

Figure 6A:
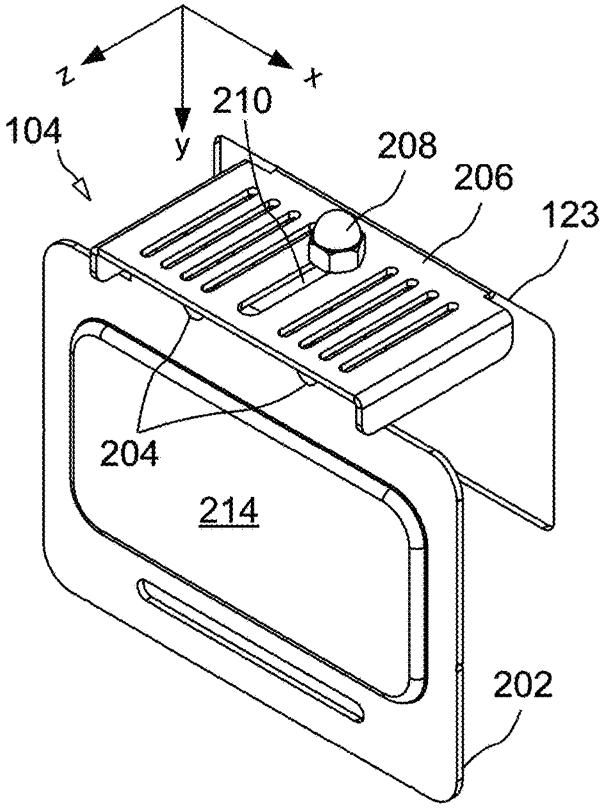
Figure 6B:
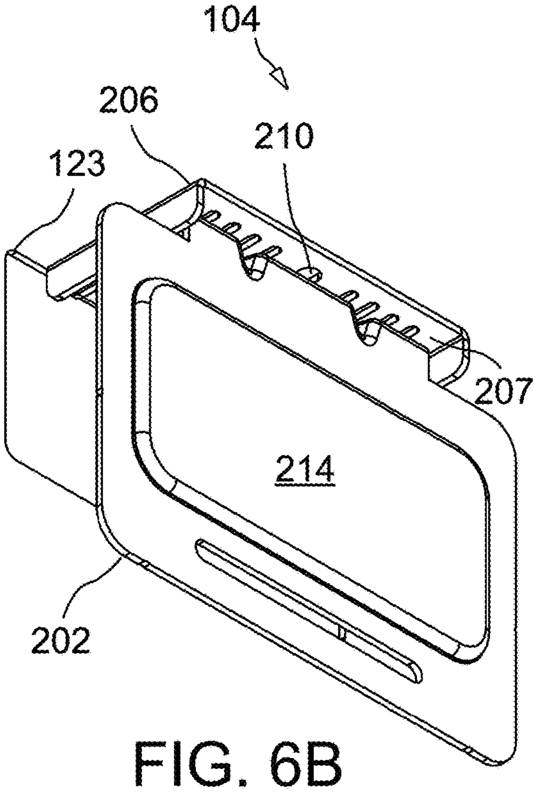
Figure 6C:
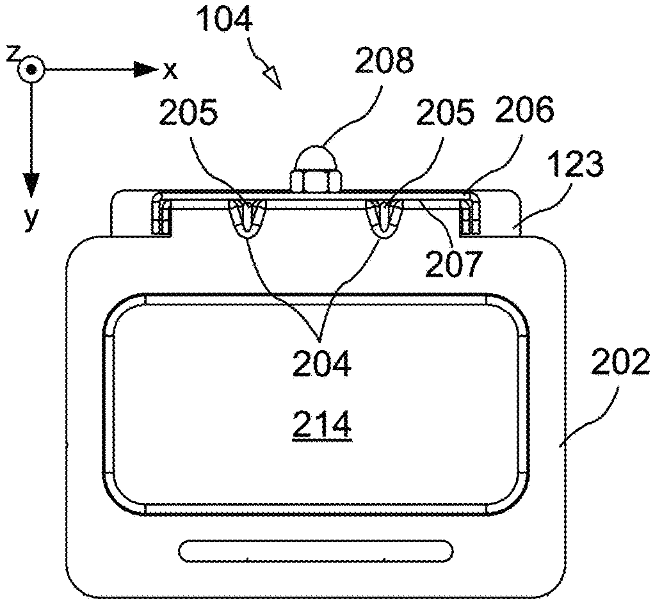
Figure 6D:
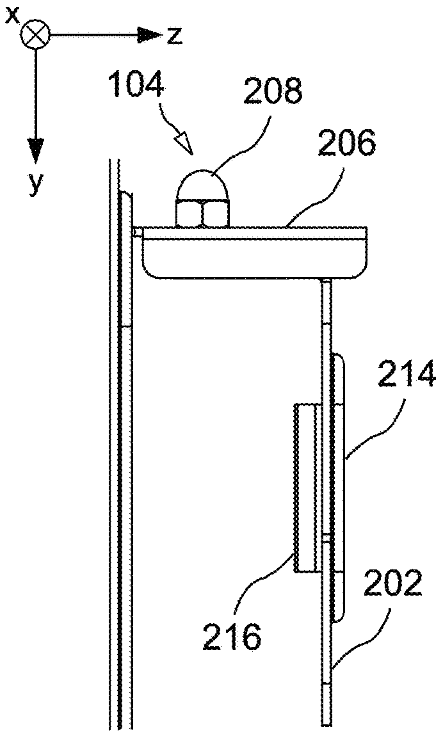

Referring to FIGS. 6A-6D, the first adjustable clamp assembly 104 is shown in greater detail. Specifically, FIG. 6A is a top perspective view of the first adjustable clamp assembly 104, FIG. 6B is a bottom perspective view, FIG. 6C is a front elevation view, and FIG. 6D is a side elevation view. In each of the figures, like reference numerals refer to like elements.

The first adjustable clamp assembly 104 includes a first fixed part 206, which is attached to the mounting plate 102, and a first movable part 202, which is slidable with respect to the first fixed part 206.

The first movable part 202 is attached to the mounting plate 102 along a first direction ("x" direction) in a plane formed by the planar part 103 of the mounting plate 102. An inner surface 207 of the first fixed part 206 faces a second direction ("y" direction). The width of the first fixed part 206 extends out of the plane formed by the planar part 103 along a third direction ("z" direction) normal to the plane.

The first movable part 202 is slidable along the width of the first fixed part 206 along the third direction ("z" direction). The first movable part 202 includes, at one end, a pair of U-shaped or V-shaped sliders 204 which are configured to move along a pair of rails 205 formed in the extend from the inner surface 207 of the first fixed part 206. The U-shaped or V-shaped sliders 204 and the pair of rails 205 together guide movement of first movable part 202.

A threaded bolt or screw extension (not shown) is also provided at the same end of the first movable part 202 and extends through a slot 210 formed in the first fixed part 206. The slot 210 guides movement of the threaded bolt or screw extension and thus further guides the movement of the first movable part 202. A threaded end cap 208 is rotatable along the threaded bolt or screw extension of the first movable part 202 and may be turned to secure the first movable part 202 in place at any position along the slot 210.

The first adjustable clamp assembly 104 may therefore be used to hold a first electronic device module (not shown) against the mounting plate 102. The first electronic device module may be inserted between the first movable part 202 and the mounting plate 102. The first movable part 202 may then be moved along the pair of rails 205 and the slot 210 of the first fixed part 206 until the first movable part 202 presses against the first electronic device module and also presses the first electronic device module against the mounting plate 102. The threaded end cap 208 may then be turned to secure the first movable part 202 and therefore hold the first electronic device module in place.

Advantageously, because the first movable part 202 is movable along the entire width of the first fixed part 206, the first adjustable clamp assembly 104 may be used to secure any electronic device module having a width within a range of widths corresponding to the range of movement of the first movable part 202. That is, the first adjustable clamp assembly 104 may be used to secure any electronic device module having a width within a range of widths corresponding to the range of possible spacings between the first movable part 202 and the mounting plate 222.

The first movable part 202 also includes an indentation 214 upon which a first adhesive-backed reclosable fastener piece 216 may be affixed to an inner surface facing the mounting plate 102. The first adhesive-backed reclosable fastener piece 216 may be affixed using, for example, an adhesive. Another adhesive-backed reclosable fastener piece may be affixed to a surface of the first electronic device module that faces the first adhesive-backed reclosable fastener piece 216 prior to the first electronic device module being inserted into the first adjustable clamp assembly 104. The interaction of the first adhesive-backed reclosable fastener piece 216 with the further adhesive-backed reclosable fastener piece affixed to the first electronic device module further holds in place the first electronic device module and prevents the first electronic device module from slipping, such as when the mounting plate 102 is mounted vertically.

Figures 7A, 7B, 7C, 7D:
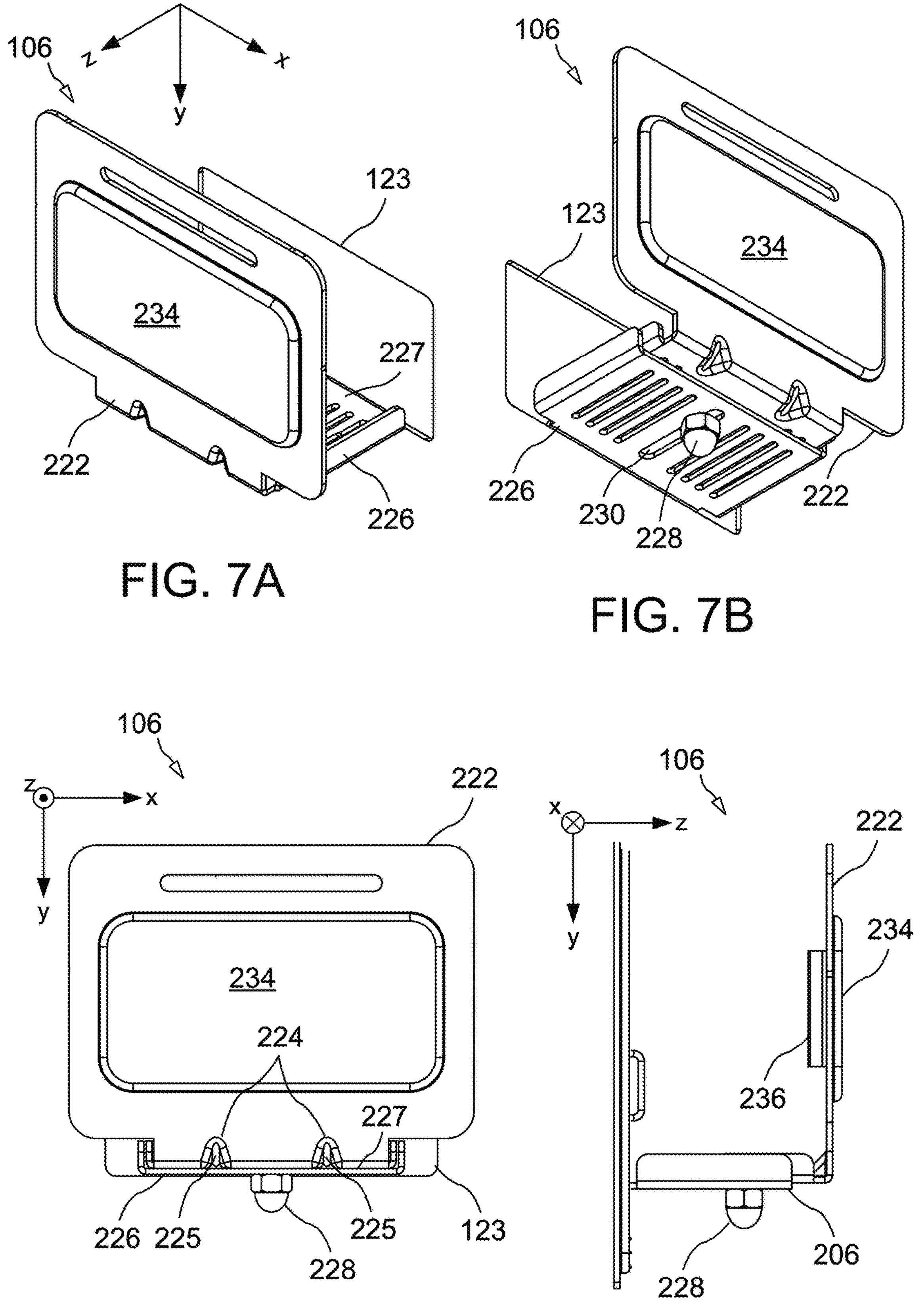

Referring to FIGS. 7A-7D, the second adjustable clamp assembly 106 is shown in greater detail. Particularly, FIG. 7A is a top perspective view of the second adjustable clamp assembly 106, FIG. 7B is a bottom perspective view, FIG. 7C is a front elevation view, and FIG. 7D is a side elevation view. In each of the figures, like reference numerals refer to like elements.

The second adjustable clamp assembly 106 includes a second fixed part 226, which is attached to the mounting plate 102, and a second movable part 222, which is slidable with respect to the second fixed part 226.

The second fixed part 226, as with the first fixed part 206, is attached to the mounting plate 102 along the first direction ("x" direction) in the plane formed by the planar part 103 of the mounting plate 102. The inner surface 227 of the second fixed part 226, however, faces in a direction ("−y" direction) that is opposite to the second direction. The width of the second fixed part 226 extends out of the plane along the third direction ("z" direction) normal to the plane formed by the planar part 103.

The second movable part 222 is slidable along the width of the second fixed part 226 and is oriented parallel to the second direction ("y" direction) in the plane formed by the planar part 103 but extends along a direction opposite to the second direction ("−y" direction).

The second movable part 222 is slidable along the width of the second fixed part 226 along the third direction ("z" direction). The second movable part 222 includes, at one end, a pair of U-shaped or V-shaped sliders 224 which are configured to move along a pair of rails 225 which extend from the inner surface 227 of the second fixed part 226. The U-shaped or V-shaped sliders 224 together with the rails 225 guide movement of the second movable part 222.

A threaded bolt or screw extension (not shown) is also provided at the same end of the second movable part 222 and extends through a slot 230 formed in the second fixed part 226. The slot 230 guides the movement of the threaded bolt or screw extension of the second movable part 222 and thus further guides the movement of the second movable part 222. A threaded end cap 228 is rotatable along the threaded bolt or screw extension of the second movable part 222 and thus may be turned to secure the second movable part 222 in place at any position along the slot 230.

The second adjustable clamp assembly 106 may therefore be used to hold a second electronic device module (not shown) against the mounting plate 102. The second electronic device module may be inserted between the second movable part 222 and the mounting plate 102. The second movable part 222 may then be moved along the pair of rails 225 and the slot 230 of the second fixed part 226 until the second movable part 222 presses against the second electronic device module and also presses the electronic device module against the mounting plate 102. The threaded end cap 228 may then be turned to secure the second movable part 222 and therefore hold the second electronic device module in place.

Advantageously, because the second movable part 222 is movable along the entire width of the second fixed part 226, the second adjustable clamp assembly 106 may be used to secure any electronic device module having a width within a range of widths corresponding to the range of movement of the second movable part 222. That is, the second adjustable clamp assembly 106 may be used to secure any electronic device module having a width within a range of widths corresponding to the range of possible spacings between the second movable part 222 and the mounting plate 222.

The second movable part 222 also includes an indentation 234 upon which a second adhesive-backed reclosable fastener piece 236 may be affixed to an inner surface facing the mounting plate 102. The second adhesive-backed reclosable fastener piece 236 may be affixed using, for example, an adhesive. Another adhesive-backed reclosable fastener piece may be affixed to a surface of the second electronic device module that faces the first adhesive-backed reclosable fastener piece prior to the second electronic device module being inserted into the second adjustable clamp assembly 106. The interaction of the second adhesive-backed reclosable fastener piece 236 with the another adhesive-backed reclosable fastener piece affixed to the second electronic device module further holds the second electronic device module is in place and prevents the second electronic device module from slipping, such as when the mounting plate 102 is vertically mounted.

Referring to FIGS. 8A-8C, the first slideable slat assembly 108 is shown in greater detail. Specifically, FIG. 8A is a perspective view of the first slideable slat assembly 108 inserted in the first slit 112, FIG. 8B is a front elevation view, and FIG. 8C is a rear elevation view. In each of the figures, like reference numerals refer to like elements.

The first slideable slat assembly 108 includes a first slat 250, a securing knob 252, and a back plate 254.

The first slat 250 extends outward from the plane formed by the planar part 103 along the third direction ("z" direction). The first slat 250 may have a U-shape with a bottom portion of the "U" extending along the first direction ("x" direction) and the arms of the "U" extending along the direction opposite to the second direction ("−y" direction).

At one end of the first slat 250 is a narrow section that is configured to extend through the opening of the first slit 112 and is attached to the back plate 254 located on an opposing side of the mounting plate 202. The back plate 254 includes a threaded bolt or screw extension (not shown) that extends forward through the opening of the first slit 112. The securing knob 252 is threaded on the inside and is rotatable along the threaded bolt or screw extension of the back plate 254.

The first slideable slat assembly 108 is mountable in the first slit 112 by inserting the back plate 254 through the insert opening 256 and then sliding the entire first slideable slat assembly 108 along the first slit 112. The securing knob 252 may then be rotated to secure first slideable slat assembly 108 in place at any position along the slot 210.

By sliding the first slideable slat assembly 108 along the first slit 112 and then securing the first slideable slat assembly 108 using the securing knob 252, the first slideable slat assembly 108 may be used to secure the first electronic device module (not shown) against the first fixed part 206. Specifically, after the first electronic device module is inserted between the first movable part 202 and the mounting plate 102, the first slideable slat assembly 108 may then be slid along the first slit 112 until the first slideable slat assembly 108 contacts the first electronic device module and presses the first electronic device module against the first fixed part 206. The securing knob 252 may then be turned to secure the first electronic device module in place against the first fixed part 206.

Advantageously, because the first slideable slat assembly 108 is movable along the entire length of the first slit 112, the first slideable slat assembly 108 may be used to secure an electronic device module having any height within a range of heights corresponding to the range of movement of the first slideable slat assembly 108. That is, the first slideable slat assembly 108 may be used to secure an electronic device module having any height within a range of heights corresponding to the range of possible spacings between the first slat 250 and the first fixed part 206.

Referring to FIGS. 9A-9C, the second slideable slat assembly 110 is shown in greater detail. Specifically, FIG. 9A is a perspective view of the second slideable slat assembly 110 inserted in the second slot 114, FIG. 9B is a front elevation view, and FIG. 9C is a rear elevation view. In each of the figures, like reference numerals refer to like elements.

The first slideable slat assembly 108 includes a second slat 260, a securing knob 262, and a back plate 264.

The second slat 260 extends outward from the plane formed by the planar part 103 along the third direction ("z" direction). The second slat 260 may have a U-shape with a bottom portion of the "U" extending along the first direction ("x" direction) and the arms of the "U" extending along the second direction ("y" direction).

At one end of the second slat 260 is a narrow section that is configured to extend through the opening of the second slit 114 and is attached to the back plate 264 located on the opposing side of the mounting plate 202. The back plate 264 includes a threaded bolt or screw extension (not shown) that extends forward through the opening of the second slit 112. The securing knob 262 is threaded on the inside and is rotatable along the threaded bolt or screw extension of the back plate 264.

The second slideable slat assembly 108 is mountable in the second slit 112 by inserting the back plate 264 through the insert opening 266 and then sliding the entire second slideable slat assembly 110 along the second slit 112. The securing knob 262 may then be rotated to secure second slideable slat assembly 108 in place at any position along the second slit 112.

By sliding the second slideable slat assembly 110 along the second slit 112 and then securing the second slideable slat assembly 110 using the securing knob 262, the second slideable slat assembly 110 may be used to secure the second electronic device module (not shown) against the second fixed part 226 of the second adjustable clamp assembly 106. Specifically, after the second electronic device module is inserted between the second movable part 222 and the mounting plate 102, the second slideable slat assembly 110 may then be slid along the second slit 112 until the second slideable slat assembly 110 contacts the second electronic device module and presses the second electronic device module against the against the second fixed part 226. The securing knob 262 may then be turned to secure the second electronic device module in place against the second fixed part 226.

Advantageously, because the second slideable slat assembly 110 is movable along the entire length of the second slit 112, the second slideable slat assembly 110 may be used to secure an electronic device module having any height within a range of heights corresponding to the range of movement of the second slideable slat assembly 110. That is, the second slideable slat assembly 110 may be used to secure an electronic device module having any height within a range of heights corresponding to the range of possible spacings between the second slat 260 and the second fixed part 226 of the second adjustable clamp assembly 106.

FIGS. 10A and 10B show an example of the universal mounting bracket 100 with an arrangement 300 of various sized and shaped electronic device modules and other components mounted on the universal mounting bracket 100. FIG. 10A is a perspective view of the arrangement 300, and FIG. 10B is a front elevation view. In each of the figures, like reference numerals refer to like elements.

In the example of FIGS. 10A and 10B, the arrangement 300 of various sized and shaped electronic device modules includes a first device module 302, which may be an image processor, a second device module 306, which may be a PC processor, and peripheral devices 304 and 308.

The first device module 302 has a first length measured along the first direction ("x" direction), a first height measured along the second direction ("y" direction), and a first thickness measured along the third direction ("z" direction). The first device module is secured to the mounting plate 102 by the combination of the first adjustable clamp assembly 104 and the first adjustable slat assembly 108.

The first device module 302 is first inserted between the first movable part 202 and the mounting plate 102 and is then moved until the first device module contacts the first fixed part 206 of the first adjustable clamp assembly 104. The first device module is then secured to the first fixed part 206 by sliding the first adjustable slat assembly 108 along the first slit 112 until the first slat 250 presses against the first device module 302. Then, the securing knob 252 is turned until the back plate 254 is secured to the mounting plate 102 and holds the first adjustable slat assembly 108 at that location along the first slit 112. Next, the first movable part 206 of the first adjustable clamp assembly 104 is moved along the rails 205 of the first fixed part 206 until the first movable part 206 presses the first device module 302 against the mounting plate 102. The first movable part 206 is then fixed in place by turning the locking knob 208. The first adhesive-backed reclosable fastener piece 216 also holds' the first device module 302 in place.

Alternatively, the first device module 302 may first be secured against the mounting plate 102 by moving and securing the first movable part 206 in the above manner, and then the first device module 302 is secured against the first fixed part 206 by moving and securing the first adjustable slat assembly 108 in the manner described.

The second device module 306 has a second length measured along the first direction ("x" direction), a second height measured along the second direction ("y" direction), and a second thickness measured along the third direction ("z" direction).

The second device module 306 is initially inserted between the second movable part 222 and the mounting plate 102 and is then moved until the second device module contacts the second fixed part 226 of the second adjustable clamp assembly 106. The second device module is then secured to the second fixed part 226 by sliding the second adjustable slat assembly 110 along the second slit 114 until the second slat 260 presses against the second device module 306. Then, the securing knob 262 is turned until the back plate 264 is secured against the mounting plate 102 and holds the second adjustable slat assembly 110 at that location along the second slit 114. Next, the second movable part 226 of the second adjustable clamp assembly 106 is moved along the rails 225 of the second fixed part 226 until the second movable part 222 presses the second device module 306 against the mounting plate 102. The second movable part 222 is then secured in place by turning the locking knob 208. The second adhesive-backed reclosable fastener piece 236 also holds the second device module 306 in position.

Alternatively, the second device module 306 may be secured against the mounting plate 102 by moving and securing the second movable part 222 in the above manner, and then the second device module 306 is secured against the second fixed part 226 by moving and securing the second adjustable slat assembly 110 in the manner described.

A peripheral device 304 may also be secured to the mounting plate 102 at the location of the mounting indentation 116. A adhesive-backed reclosable fastener piece (not shown) is affixed to a surface of the peripheral device 304 and secured against the adhesive-backed reclosable fastener piece 118 that is affixed to the mounting indentation 116. The peripheral device 304 may be of any length or height that does not interfere with the mounting of any other device modules or connections on the mounting plate 102. The peripheral device 304 may also have any thickness that does not interfere with the placement of the mounting plate 102.

Another peripheral device 308 may also be secured to the mounting plate 102 at the location of one of the indentations 126. A adhesive-backed reclosable fastener piece (not shown) may be affixed to a surface of the peripheral device 308 and secured against a adhesive-backed reclosable fastener piece or strip that is affixed to the indentation 126. The peripheral device 308 may be of any length or height that does not interfere with the mounting of any other device modules or connections on the mounting plate 102 and may have any thickness that does not interfere with the placement of the mounting plate 102.

One or more pull ties 312 may be used to secure cabling 310 to the mounting plate 102 by running the pull ties 312 through one or more of the pull tie receptacles 132. One or more further pull ties 314 to secure other cabling (not shown) by running further pull ties 314 through one or more further pull tie receptacles 132.

FIGS. 11A and 11B show another example of the universal mounting bracket 100 in which another arrangement 400 of various sized and shaped electronic device modules, together with other components and wiring, are mounted on the universal mounting bracket 100. More particularly, FIG. 11A is a perspective view of the arrangement 400, and FIG. 11B is a front elevation view. In each of the figures, like reference numerals refer to like elements.

In the example of FIGS. 11A and 11B, the arrangement 400 of various sized and shaped electronic device modules includes a first device module 402, which may be an image processor, a second device module 406, which may be a PC processor, and other peripheral devices 404 and 408.

The first device module 402 has a first length measured along the first direction ("x" direction), a first height measured along the second direction ("y" direction), and a first thickness measured along the third direction ("z" direction). The first device module is secured to the mounting plate 102 by the combination of the first adjustable clamp assembly 104 and the first adjustable slat assembly 108. The first length, first height and/or first thickness of the first device module 402 may be different than the first length, first height and/or first thickness of the first device module 302 shown in FIGS. 10A and 10B.

The first device module 402 is first inserted between the first movable part 202 and the mounting plate 102 and is then moved until the first device module 402 contacts the first fixed part 206 of the first adjustable clamp assembly 104. The first device module 402 is then secured to the first fixed part 206 by sliding the first adjustable slat assembly 108 along the first slit 112 until the first slat 250 presses against the first device module 402. Then, the securing knob 252 is turned until the back plate 254 is secured against the mounting plate 102 and holds the first adjustable slat assembly 108 at that location along the first slit 112. Next, the first movable part 206 of the first adjustable clamp assembly 104 is moved along the rails 205 of the first fixed part 206 until the first movable part 206 presses the first device module 402 against the mounting plate 102. The first movable part 206 is then secured in place by turning the locking knob 208. The first adhesive-backed reclosable fastener piece 216 also holds the first device module 402 in position.

Alternatively, the first device module 402 may first be secured against the mounting plate 102 by moving and securing the first movable part 206 in the same manner, and then the first device module 402 is secured against the first fixed part 206 by moving and securing the first adjustable slat assembly 108 in the manner described.

The second device module 406 has a second length measured along the first direction ("x" direction), a second height measured along the second direction ("y" direction), and a second thickness measured along the third direction ("z" direction). The second length, second height and/or second thickness of the second device module 406 may be different than the second length, second height and/or second thickness of the second device module 306 shown in FIGS. 10A and 10B The second device module 406 is initially inserted between the second movable part 222 and the mounting plate 102 and is then moved until the second device module 406 contacts the second fixed part 226 of the second adjustable clamp assembly 106. The second device module 406 is then secured to the second fixed part 226 by sliding the second adjustable slat assembly 110 along the second slit 114 until the second slat 260 presses against the second device module 406. Then, the securing knob 262 is turned until the back plate 264 is secured against the mounting plate 102 and holds the second adjustable slat assembly 110 at that location. Next, the second movable part 226 of the second adjustable clamp assembly 106 is moved along the rails 225 of the second fixed part 226 until the second movable part 222 presses the second device module 406 against the mounting plate 102. The second movable part 222 is then secured in place by turning the locking knob 208. The second adhesive-backed reclosable fastener piece 236 also holds the second device module 406 in position.

Alternatively, the second device module 406 may first be secured against the mounting plate 102 by moving and securing the second movable part 222 in the above manner, and then the second device module 406 is secured against the second fixed part 226 by moving and securing the second adjustable slat assembly 110 in the manner described.

A peripheral device 404 may also be secured to the mounting plate 102 at the location of the mounting indentation 116. A adhesive-backed reclosable fastener piece (not shown) is affixed to a surface of the peripheral device 404 and secured to the adhesive-backed reclosable fastener piece 118 that is affixed to the mounting indentation 116. The peripheral device 404 may be of any length or height that does not interfere with the mounting of any other device modules or connections on the mounting plate 102 and may be of any thickness that does not interfere with the placement of the mounting plate 102.

One or more pull ties 412, 414 may be used to secure cabling 410 to the mounting plate 102 by running the pull ties 412, 414 through one or more of the pull tie receptacles 132.

Accordingly, the universal mounting bracket 100 is suitable for mounting a wide variety of different sized and shaped electronic device modules and peripheral devices. Though only two examples of arrangements are described, other combinations and arrangements are also within the scope of the disclosure.

Because the first adjustable slat assembly 108 is movable in the second direction ("y" direction) along the entire length of the first slit 112 and is securable to any location along the length of the first slit 112, the first adjustable slat assembly 108 may be used to secure any first device module whose height permits it to fit between the first slat 250 and the first fixed part 206. That is, the first adjustable slat assembly 108 may be used to secure any first device module having a height within a range of heights corresponding to a range of possible spacings between the first slat 250 and the first fixed part 206, i.e., corresponding to the length of the first slit 112.

Moreover, because the first movable part 202 is movable in the third direction ("z" direction) along the entire length of the slot 210 of the first fixed part 206 and is securable to any location along the length of the slot 210, the first adjustable clamp assembly 104 may be used to secure any first device module whose thickness permits it to fit between the first movable part 202 and the mounting plate 102. That is, the first adjustable clamp assembly 104 may be used to secure any first device module having a thickness within a range of thicknesses corresponding to a range of possible spacings between first movable part 202 and the mounting plate 102, i.e., corresponding to the length of the slot 210 of the first fixed part 206.

Additionally, because neither the first adjustable slat assembly 108 nor the first adjustable clamp assembly 104 provides a constraint in the first direction ("x" direction), the first adjustable slat assembly 108 and the first adjustable clamp assembly 104 may be used in combination to secure any first device module whose length is, at most, less than the length of the planar part 103 of the mounting plate 102 along the first direction, or at least, does not interfere with the mounting of any other device modules or connections on the mounting plate.

Because the second adjustable slat assembly 110 is movable in the second direction ("y" direction) along the entire length of the second slit 114 and is securable to any location along the length of the second slit 114, the second adjustable slat assembly 110 may be used to secure any second device module whose height permits it to fit between the second slat 260 and the second fixed part 226. That is, the second adjustable slat assembly 110 may be used to secure any second device module having a height within a range of heights corresponding to a range of possible spacings between the second slat 260 and the second fixed part 226, i.e., corresponding to the length of the second slit 114.

Moreover, because the second movable part 222 is movable in the third direction ("z" direction) along the entire length of the slot 230 of the second fixed part 226 and is securable to any location along the length of the slot 230, the second adjustable clamp assembly 106 may be used to secure any second device module whose thickness permits it to fit between the second movable part 222 and the mounting plate 102. That is, the second adjustable clamp assembly 106 may be used to secure any second device module having a thickness within a range of thicknesses corresponding to a range of possible spacings between second movable part 222 and the mounting plate 102, i.e., corresponding to the length of the slot 230 of the second fixed part 226.

Additionally, because neither the second adjustable slat assembly 110 nor the second adjustable clamp assembly 106 provides a constraint in the second direction ("x" direction), the second adjustable slat assembly 110 and the second adjustable clamp assembly 106 may be used in combination to secure any second device module whose length is less than the length of the planar part 103 of the mounting plate 102 or, at least, does not interfere with the mounting of any other device modules or connections on the mounting plate 102.

INDUSTRIAL APPLICABILITY

To solve the aforementioned problems, the present embodiments provide a universal mounting bracket upon which may be mounted one or more electronic device modules, such as processor units and associated modules, having various sizes and shapes.

It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments.

However, one skilled in the art would understand that various embodiments may be practiced without such specific details.

Although the features and elements of aspects of the embodiments are described as being in particular combinations, each feature or element may be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus, the embodiments are capable of many variations in detailed implementation that may be derived from the description contained herein by a person skilled in the art. No element, act, or instruction used in the description of the present application should be construed as critical or essential to the embodiments unless explicitly described as such. Also, as used herein, the article "a" is intended to include one or more items.

In addition, the above disclosed methods are not meant to limit the aspects of the embodiments, or to suggest that the aspects of the embodiments should be implemented following the aforementioned methods. The purpose of the aforementioned methods is to facilitate the understanding of one or more aspects of the embodiments and to provide the reader with one or many possible implementations of the processed discussed herein. It should be understood by one of ordinary skill in the art that the steps of the aforementioned methods may be performed in a different order and that some steps may be eliminated or substituted.

All United States patents and applications, foreign patents, and publications discussed above are hereby incorporated herein by reference in their entireties.

ALTERNATE EMBODIMENTS

Alternate embodiments may be devised without departing from the spirit or the scope of the embodiments.

What is claimed is:

1. A mounting bracket for holding electronic device modules having various sizes and shapes, the mounting bracket comprising:

(a) a mounting plate;

(b) an adjustable clamp assembly, including (1) a fixed part attached to the mounting plate, and (2) a movable part that is movable to any spacing from the mounting plate that is within a preset range of spacings, the movable part being securable in place anywhere within the preset range of spacings, (3) the adjustable clamp assembly thereby being adjustable to hold, against the mounting plate using the movable part, an electronic device module having any thickness within a range of thicknesses corresponding to the preset range of spacings;

(c) an adhesive-backed reclosable fastener piece affixed to a surface of the movable part that faces the mounting plate, the adhesive-backed reclosable fastener piece being configured to adhere to another adhesive-backed reclosable fastener piece disposed on a surface of the electronic device module to further secure the electronic device module in place while the adjustable clamp assembly holds the electronic device module;

(d) a movable slat that is movable along the mounting plate to any distance from the fixed part that is within a fixed range of distances, and being securable to the mounting plate anywhere within the fixed range of distances, (1) the movable slat thereby being movable to hold the electronic device module against the fixed part by moving and securing the movable slat, the electronic device module having any height within a range of heights corresponding to the fixed range of distances; and (e) a plurality of recesses formed in the mounting plate and configured to relieve stresses on the mounting plate;

(f) the mounting bracket thereby being able to hold electronic device modules of various sizes and shapes upon the electronic device module having a thickness within the range of thicknesses and a height within the range of heights.

2. The mounting bracket of claim 1, wherein (a) the mounting plate includes a slit that extends along part of the mounting plate in a first direction, and (b) the movable slat is movable along the slit, and (c) the range of heights corresponds to a length of the slit.

3. The mounting bracket of claim 2, wherein (a) the movable slat includes (1) a holding part disposed on a same side of the mounting plate as the fixed part and configured to hold the electronic device module against the fixed part, and (2) a securing part that extends from the holding part through the slit to another side of the mounting plate, and being securable to any location along the length of the slit.

4. The mounting bracket of claim 2, wherein (a) the fixed part is attached to the mounting plate along a second direction in the mounting plate, and (b) the fixed part extends outward from the mounting plate along a third direction away from a plane formed by the first direction and the second direction.

5. The mounting bracket of claim 4, wherein (a) the fixed part includes a fixed part slot that extends along the third direction, (b) the movable part is slidably coupled at one end to the fixed part slot and movable in the third direction, the movable part being securable to the fixed part at any location along a length of the fixed part slot, and (c) the range of thicknesses corresponds to the length of the fixed part slot.

6. The mounting bracket of claim 5, wherein (a) the one end of the movable part includes a threaded bolt that extends through the fixed part slot and that is securable to the fixed part using a threaded cap fastener.

7. The mounting bracket of claim 5, wherein (a) the movable part extends away from the fixed part along the first direction.

8. The mounting bracket of claim 1, further comprising (a) a plurality of openings formed in the mounting plate and configured to relieve stresses on the mounting plate.

9. The mounting bracket of claim 1, further comprising (a) a plurality of openings formed along each edge of the mounting plate and configured to enable mounting of the mounting plate in an electronics rack.

10. The mounting bracket of claim 1, further comprising
(a) a plurality of further slots formed along each edge of the mounting plate and configured to enable mounting of the mounting plate on a stand.

11. A mounting bracket for holding electronic device modules having various sizes and shapes, the mounting bracket comprising:
(a) a mounting plate;
(b) a first adjustable clamp assembly, including
(1) a first fixed part attached to the mounting plate, and
(2) a first movable part that is movable to any spacing from the mounting plate that is within a first preset range of spacings, the first movable part being securable in place anywhere within the first preset range of spacings,
(3) the first adjustable clamp assembly thereby being adjustable to hold, against the mounting plate using the first movable part, a first electronic device module having a thickness within a first range of thicknesses corresponding to the first preset range of spacings;
(c) a first adhesive-backed reclosable fastener piece affixed to a surface of the first movable part that faces the mounting plate, the first adhesive-backed reclosable fastener piece being configured to adhere to another adhesive-backed reclosable fastener piece disposed on a surface of the first electronic device module to further secure the first electronic device module in place while the first adjustable clamp assembly holds the first electronic device module;
(d) a first movable slat that is movable along the mounting plate to any distance from the first fixed part that is within a first fixed range of distances, and being securable to the mounting plate anywhere within the first fixed range of distances,
(1) the first movable slat thereby being movable to hold the first electronic device module against the first fixed part by moving and securing the first movable slat, the first electronic device module having a height within a first range of heights corresponding to the first fixed range of distances;
(e) a second adjustable clamp assembly, including
(1) a second fixed part attached to the mounting plate, and
(2) a second movable part that is movable to any spacing from the mounting plate that is within a second preset range of spacings, the second movable part being securable in place anywhere within the second preset range of spacings,
(3) the second adjustable clamp assembly thereby being adjustable to hold, against the mounting plate using the second movable part, a second electronic device module having a thickness within a second range of thicknesses corresponding to the second preset range of spacings;
(f) a second adhesive-backed reclosable fastener piece affixed to a surface of the second movable part that faces the mounting plate, the second adhesive-backed reclosable fastener piece being configured to adhere to another adhesive-backed reclosable fastener piece disposed on a surface of the second electronic device module to further secure the second electronic device module in place while the second adjustable clamp assembly holds the second electronic device module
(g) a second movable slat that is movable along the mounting plate to any distance from the second fixed part that is within a second fixed range of distances, and being securable to the mounting plate anywhere within the second fixed range of distances,
(1) the second movable slat thereby being movable to hold the second electronic device module against the second fixed part by moving and securing the movable slat, the second electronic device module having a height within a second range of heights corresponding to the second fixed range of distances; and
(h) a plurality of recesses formed in the mounting plate and configured to relieve stresses on the mounting plate;
(i) the mounting bracket thereby being able to hold first and second electronic device modules of various sizes and shapes upon the first electronic device module having a respective thickness within the first range of thicknesses and a respective height within the first range of heights and the second electronic device module having a respective thickness within the second range of thicknesses and a respective height within the second fixed range of heights.

12. The mounting bracket of claim 11, wherein
(a) the mounting plate includes first and second slits slit that each extend along a respective part of the mounting plate in a first direction, and
(b) the first movable slat is movable along the first slit,
(c) the second movable slat is movable along the second slit, and
(d) the first range of heights corresponds to a length of the first slit, and
(e) the second range of heights corresponds to a length of the second slit.

13. The mounting bracket of claim 12, wherein
(a) the first movable slat includes
(1) a first holding part disposed on a same side of the mounting plate as the first fixed part and configured to hold the first electronic device module against the first fixed part, and
(2) a first securing part that extends from the first holding part through the first slit to another side of the mounting plate, and being securable to any location along the length of the first slit, and
(b) the second movable slat includes
(1) a second holding part disposed on the same side of the mounting plate as the second fixed part and configured to hold the second electronic device module against the second fixed part, and
(2) a second securing part that extends from the second holding part through the second slit to the another side of the mounting plate, and being securable to any location along the length of the second slit.

14. The mounting bracket of claim 12, wherein
(a) the first fixed part is attached to the mounting plate along a second direction in the mounting plate, and
(b) the first fixed part extends outward from the mounting plate along a third direction away from a plane formed by the first direction and the second direction,
(c) the second fixed part is attached to the mounting plate along the second direction, and
(b) the second fixed part extends outward from the mounting plate along a direction opposite to the third direction.

15. The mounting bracket of claim 14, wherein
(a) the first fixed part includes a first fixed part slot that extends along the third direction,
(b) the first movable part is slidably coupled at one end to the first fixed part slot and movable in the third direction, the first movable part being securable to the first fixed part at any location along a length of the first fixed part slot, (c) the first range of thicknesses corresponds to the height of the first fixed part slot, (d) the second fixed part includes a second fixed part slot that extends along the third direction, (e) the second movable part is slidably coupled at one end to the second fixed part slot and movable in the third direction, the second movable part being securable to the second fixed part at any location along a length of the second fixed part slot, and (f) the second range of thicknesses corresponds to the length of the second fixed part slot.

16. The mounting bracket of claim 11, further comprising (a) a plurality of openings formed in the mounting plate and configured to relieve stresses on the mounting plate.

17. A mounting bracket for holding electronic device modules having various sizes and shapes, the mounting bracket comprising:

(a) a mounting plate;

(b) an adjustable clamp assembly, including (1) a fixed part attached at one end to the mounting plate and extending outward away from the mounting plate, the fixed part including (A) at least one rail located on a surface of the fixed part, and (2) a movable part, including (A) a first arm having a surface that faces the surface of the fixed part, the surface including at least one slider configured to move along the at least one rail whereby the at least one slider and the least one rail combine to guide movement of the movable part, and (B) a second arm attached to the first arm and having a surface that faces the mounting plate, the movable part being movable to any spacing between the second arm and the mounting plate that is within a preset range of spacings, the movable part being securable in place anywhere within the preset range of spacings, (3) the adjustable clamp assembly thereby being adjustable to hold, against the mounting plate using the second arm of the movable part, an electronic device module having any thickness within a range of thicknesses corresponding to the preset range of spacings;

(c) an adhesive-backed reclosable fastener piece affixed to a surface of the movable part that faces the mounting plate, the adhesive-backed reclosable fastener piece being configured to adhere to another adhesive-backed reclosable fastener piece disposed on a surface of the electronic device module to further secure the electronic device module in place while the adjustable clamp assembly holds the electronic device module;

(d) a movable slat that is movable along the mounting plate to any distance from the fixed part that is within a fixed range of distances, and being securable to the mounting plate anywhere within the fixed range of distances, (1) the movable slat thereby being movable to hold the electronic device module against the fixed part by moving and securing the movable slat, the electronic device module having any height within a range of heights corresponding to the fixed range of distances; and (e) a plurality of recesses formed in the mounting plate and configured to relieve stresses on the mounting plate;

(f) the mounting bracket thereby being able to hold electronic device modules of various sizes and shapes upon the electronic device module having a thickness within the range of thicknesses and a height within the range of heights.

18. The mounting bracket of claim 17, further comprising (a) a plurality of openings formed in the mounting plate and configured to relieve stresses on the mounting plate.

19. The mounting bracket of claim 17, further comprising (a) a further adjustable clamp assembly, including (1) a further fixed part attached at one end to the mounting plate and extending outward away from the mounting plate, the further fixed part including (A) at least one rail located on a surface of the further fixed part, and (2) a further movable part, including (A) a first arm having a surface that faces the surface of the further fixed part, the surface including at least one slider configured to move along the at least one rail whereby the at least one slider and the least one rail combine to guide movement of the further movable part, and (B) a second arm attached to the first arm and having a surface that faces the mounting plate, the further movable part being movable to any spacing between the second arm and the mounting plate that is within a further preset range of spacings, the further movable part being securable in place anywhere within the further preset range of spacings, (3) the further adjustable clamp assembly thereby being adjustable to hold, against the mounting plate using the second arm of the further movable part, a further electronic device module having a thickness within a further range of thicknesses corresponding to the further preset range of spacings;

(b) a further adhesive-backed reclosable fastener piece affixed to a surface of the further movable part that faces the mounting plate, the further adhesive-backed reclosable fastener piece being configured to adhere to yet another adhesive-backed reclosable fastener piece disposed on a surface of the further electronic device module to further secure the further electronic device module in place while the further adjustable clamp assembly holds the further electronic device module; and (c) a further movable slat that is movable along the mounting plate to any distance from the further fixed part that is within a further fixed range of distances, and being securable to the mounting plate anywhere within the further fixed range of distances, (1) the further movable slat thereby being movable to hold the further electronic device module against the further fixed part by moving and securing the movable slat, the further electronic device module having a height within a further range of heights corresponding to the further fixed range of distances;

(d) the mounting bracket thereby being able to hold further electronic device modules of various sizes and shapes upon the further electronic device module having a respective thickness within the further range of thicknesses and a respective height within the further fixed range of heights.

20. The mounting bracket of claim 19, further comprising (a) a plurality of openings formed in the mounting plate and configured to relieve stresses on the mounting plate.

* * * * *